(12) United States Patent
Suzuki et al.

(10) Patent No.: US 8,018,162 B2
(45) Date of Patent: Sep. 13, 2011

(54) SURFACE WAVE EXCITATION PLASMA PROCESSING SYSTEM

(75) Inventors: Masayasu Suzuki, Kyoto (JP); Tetsuya Saruwatari, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 1019 days.

(21) Appl. No.: 11/910,202

(22) PCT Filed: Apr. 26, 2006

(86) PCT No.: PCT/JP2006/308732
§ 371 (c)(1),
(2), (4) Date: Sep. 28, 2007

(87) PCT Pub. No.: WO2006/120904
PCT Pub. Date: Nov. 16, 2006

(65) Prior Publication Data
US 2009/0232715 A1     Sep. 17, 2009

(30) Foreign Application Priority Data
May 12, 2005  (JP) .................................. 2005-139454

(51) Int. Cl.
*H05B 31/26* (2006.01)
(52) U.S. Cl. ......... 315/111.21; 315/111.51; 315/111.71; 118/723 NW
(58) Field of Classification Search .......... 315/111.21–111.91; 118/723 MW, 723 ME, 118/723 AN; 156/345.35, 345.36, 345.41
See application file for complete search history.

(56) References Cited

U.S. PATENT DOCUMENTS

| | | | | |
|---|---|---|---|---|
| 5,804,923 A * | 9/1998 | Iio et al. | .................. | 315/111.21 |
| 5,911,852 A * | 6/1999 | Katayama et al. | ....... | 156/345.41 |
| 6,446,573 B2 * | 9/2002 | Hirayama et al. | ..... | 118/723 MW |
| 7,584,714 B2 * | 9/2009 | Chen et al. | ............ | 118/723 MW |
| 7,819,082 B2 * | 10/2010 | Ohmi et al. | ........... | 118/723 MW |
| 2004/0107910 A1 * | 6/2004 | Nakata et al. | ......... | 118/723 MW |
| 2005/0000446 A1 * | 1/2005 | Nakata et al. | ......... | 118/723 MW |

FOREIGN PATENT DOCUMENTS

| | | |
|---|---|---|
| JP | 2004-014262 | 1/2004 |
| JP | 2004-285396 | 10/2004 |
| JP | 2005-033100 | 2/2005 |
| JP | 2005-33100 | 2/2005 |

OTHER PUBLICATIONS

Chinese First Examination Report of China Patent Application No. 200680001834.8, dated Feb. 25, 2010.

* cited by examiner

*Primary Examiner* — Douglas W Owens
*Assistant Examiner* — Tung X Le
(74) *Attorney, Agent, or Firm* — J.C. Patents

(57) ABSTRACT

To sustain uniform generation of plasma constantly over a large area. In the surface wave excitation plasma processing device, a plasma source includes: a microwave generator, a microwave waveguide and a dielectric block; and a plasma source also includes: a microwave generator, a microwave waveguide and a dielectric block. The lid of a chamber is fixed onto the microwave waveguides in parallel, and the dielectric blocks disposed in the chamber. A reflecting plate is disposed between the dielectric blocks so that electromagnetic waves propagating through the dielectric blocks are prevented from advancing into the counterpart dielectric blocks as reflected waves. Consequently, the plasma sources are controlled independently. Furthermore, a side reflector is disposed at outer circumference of each of the dielectric blocks so that a standing waves of the electromagnetic waves propagating through the dielectric blocks is formed thus forming a large area standing wave mode of surface waves uniformly.

9 Claims, 4 Drawing Sheets

SURFACE WAVE EXCITATION PLASMA PROCESSING SYSTEM

CROSS-REFERENCE TO RELATED APPLICATION

This application claims the priority benefit of Japan application serial no. 2005-139454, filed May 12, 2005. All disclosure of the Japan application is incorporated herein by reference.

BACKGROUND OF THE INVENTION

1. Field of the Invention

The present invention relates to a surface wave excitation plasma processing device for performing various treatments by using surface wave excitation plasma.

2. Description of Related Art

As for plasma processing devices capable of generating plasma with high density and over a large area, devices using surface wave excitation plasma are well known. In such devices, it is well known to those skilled in the art that, the microwave waveguide is branched and disposed on a dielectric plate in parallel, such that microwaves guided from a microwave generating part propagate through each microwave waveguide via a plurality of branches, and microwave power is acquired from the dielectric plate in a wider range, thereby realizing a device capable of uniform generation of plasma over a large area (with reference to, for example, Patent Document 1).

[Patent Document 1] Japanese Patent Publication No. 2005-33100 (Page 2, FIGS. 1, 4).

By using the device described in the Patent Document 1, the microwave power can be distributed on a plurality of microwave waveguides with branches so as to generate plasma in a large area. However, in the device described in the Patent Document 1, due to the slight changes of the plasma as a load, the combining status between the microwave power and the plasma of each waveguide is also changed sometimes, such that the distribution ratio of the power input into each waveguide is changed, thus resulting in a failure of obtaining uniform plasma.

SUMMARY OF THE INVENTION (1) The present invention provides a surface wave excitation plasma processing device includes two or more plasma source parts and a reflecting plate. The plasma source part includes: a microwave generating part, for generating microwaves; a microwave waveguide, for guiding the microwaves from the microwave generating part and allowing the microwaves propagating there-through; a slot antenna, as an opening part with a predetermined shape on an H surface of the microwave waveguide; and a dielectric member, for generating a surface wave excitation plasma by guiding the microwaves from the slot antenna of the microwave waveguide and forming surface waves (SW). The reflecting plate is disposed between adjacent side surfaces of each of the two or more dielectric members disposed in parallel.

(2) In the surface wave excitation plasma processing device, at least a surface of the reflecting plate is an electrical conductor, and is electrically connected to a frame which has the dielectric members.

(3) In the surface wave excitation plasma processing device, a side reflector is disposed at an outer circumference of the two or more dielectric members, at least has a surface as an electrical conductor, and is electrically connected to the frame.

(4) In the surface wave excitation plasma processing device, a dielectric plate is disposed, for at least covering an exposed part of the reflecting plate.

According to the present invention, as two or more plasma source parts including a microwave generating part, a microwave waveguide and a dielectric member are disposed, and a reflecting plate is disposed between each of the two dielectric members, so that interferences between the adjacent dielectric members are prevented. Therefore, each plasma generating part can be adjusted independently, so as to maintain a uniform generation of the plasma over a large area stably.

In order to make the aforementioned and other objects, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a schematic view of a structure of a plasma source for an SWP processing device according to an embodiment of the present invention, in which

DESCRIPTION OF EMBODIMENTS

Figure 1:
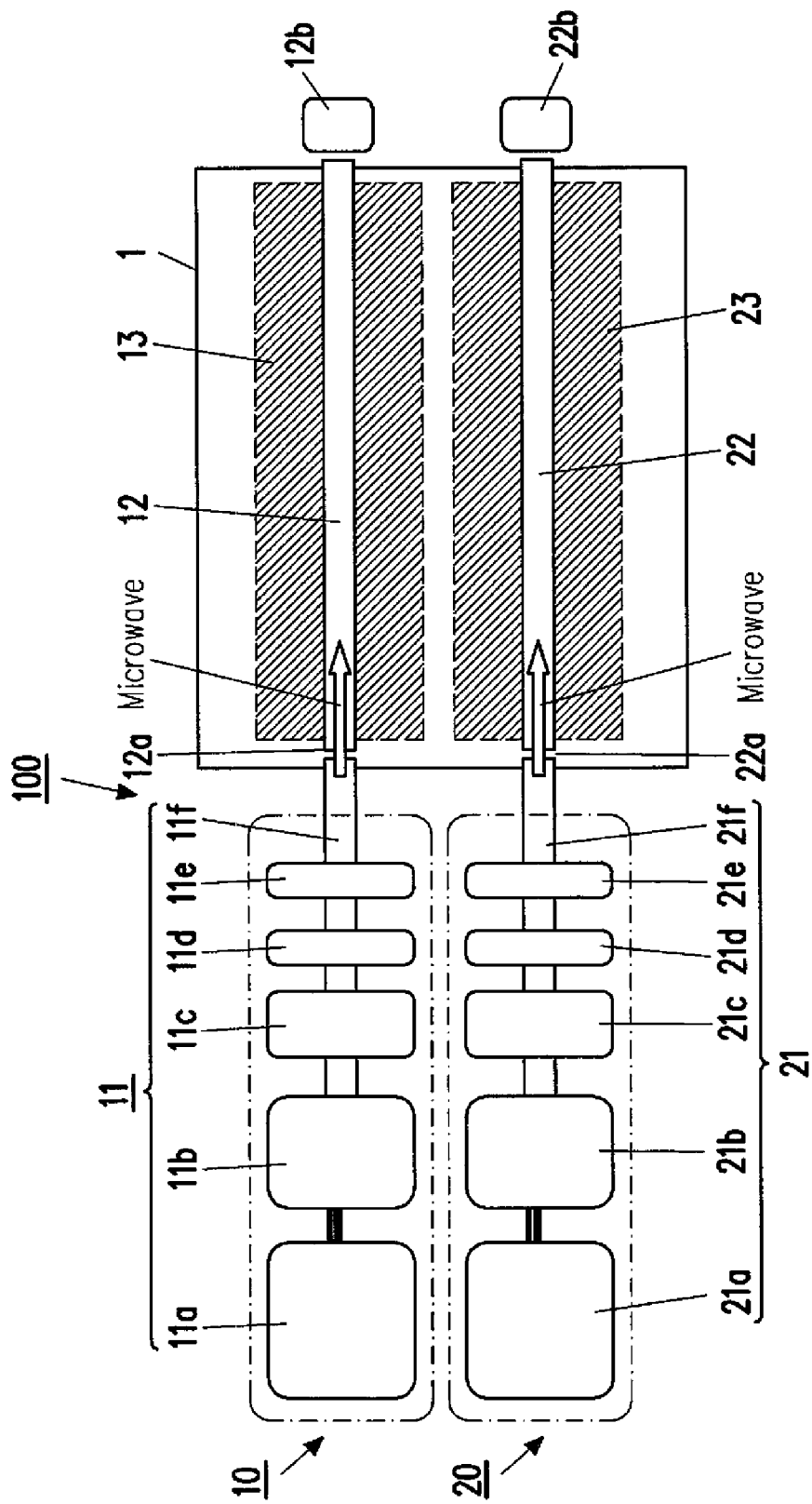
FIG. 1 is a plan view schematically showing a general structure of an SWP processing device according to an embodiment of the present invention.
Figure 2:
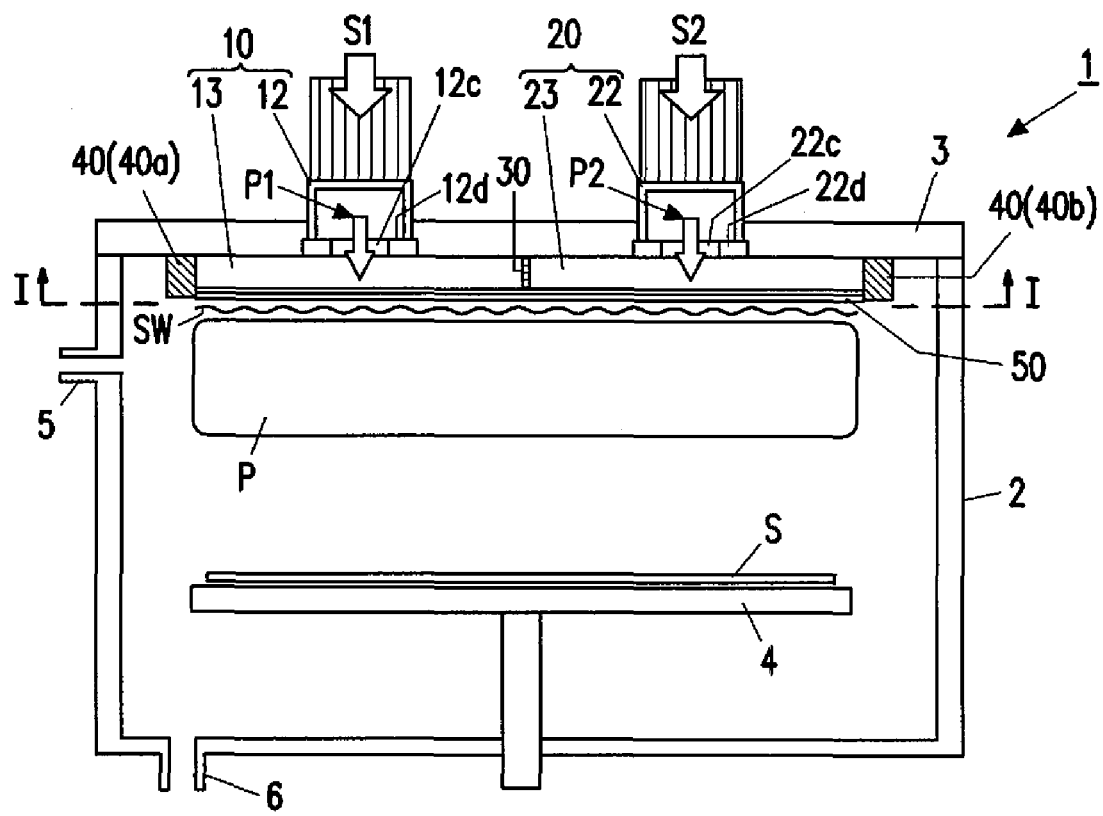
FIG. 2 is a cross-sectional view schematically showing structures of the main parts for an SWP processing device according to an embodiment of the present invention.

Hereinafter, a surface wave excitation plasma (SWP: Surface Wave Plasma) processing device (hereinafter briefly referred to as SWP processing device) according to an embodiment of the present invention is illustrated with reference to FIGS. 1-4. FIG. 1 is a plan view schematically showing a general structure of an SWP processing device according to an embodiment of the present invention. FIG. 2 is a cross-sectional view schematically showing structures of the main parts for an SWP processing device according to an embodiment of the present invention.

Referring to FIGS. 1 and 2, an SWP processing device 100 includes a chamber 1 and two plasma sources 10, 20. The chamber 1 is a sealed frame for performing plasma processing on a substrate to be processed. The plasma source 10 includes a microwave generator 11, a microwave waveguide 12, and a dielectric block 13. The microwave generator 11 has a high voltage power supply 11a, a microwave oscillator 11b, an insulator 11c, a directional coupler 11d, an integrator 11e, and a connecting pipe 11f, and means for oscillating and outputting the microwaves to an end surface of the microwave waveguide 12.

The microwave waveguide 12 is made of non-magnetic materials such as aluminum alloy, copper, and copper alloy, and installed at the upper portion of the chamber 1. The microwave waveguide 12 is a tube extending in the left-right direction in FIG. 1. A microwave inlet 12a connected to the connecting pipe 11f is disposed at the left end surface of the microwave waveguide 12, and a terminal coupler 12b is disposed at the right end surface. Microwaves M guided therein via the microwave inlet 12a travels towards the right side.

The dielectric block 13 is a plan plate made of quartz, alumina, zirconia, and connected to the lower surface of the microwave waveguide 12 and disposed in the chamber 1. As described below, microwave power is guided into the dielectric block 13 through the microwave waveguide 12, so as to generate plasma in the internal space of the chamber 1.

The plasma source 20 has the same structure as the plasma source 10. The microwave generator 21 has the same size, shape, and specification as the microwave generator 11, the microwave waveguide 22 has the same size, shape, and specification as the microwave waveguide 12, and the dielectric block 23 has the same size, shape, and specification as the dielectric block 13. That is to say, plasma sources 10, 20 having the same structure are disposed in the chamber 1. Therefore, the plasma source 10 is taken as an example for being mainly described below.

Referring to FIG. 2, the components of the SWP processing device 100 are described in detail. The chamber 1 is a sealed frame which has a chamber body 2 and a lid 3 disposed above the body 2. A substrate holder 4, a gas inlet 5, and a vacuum outlet 6 are disposed in the chamber body 2. The substrate holder 4 is used to hold the processed substrate S. The gas inlet 5 is connected to a gas supply system (not shown) via a fitting pipe to guide specific gas into the chamber 10. The vacuum outlet 6 is connected to a vacuum pump (not shown) via a fitting pipe and used to discharge the gas out of the chamber 10.

Microwave waveguides 12, 22 are installed on the lid 3 in parallel. On a bottom plate 12d of the microwave waveguide 12, a plurality of slot antennas 12c is disposed along the axis direction of the pipe (vertical to the paper surface) spaced apart by a predetermined interval. The slot antennas 12c are rectangular openings penetrating through the bottom plate 12d. The inner surface of the bottom plate 12a is called magnetic interface (H surface). The microwave waveguide 22 has the same structure as the microwave waveguide 12.

The dielectric block 13 is connected to the bottom plate 12d of the microwave waveguide 12 and disposed at the lower surface of the lid 3, so as to maintain the air-tightness of the chamber 10. Similarly, the dielectric block 23 is also disposed at the lower side of the microwave waveguide 22. Therefore, the dielectric blocks 13 and 23 are kept spaced apart by a predetermined interval and disposed in parallel.

Figure 3:
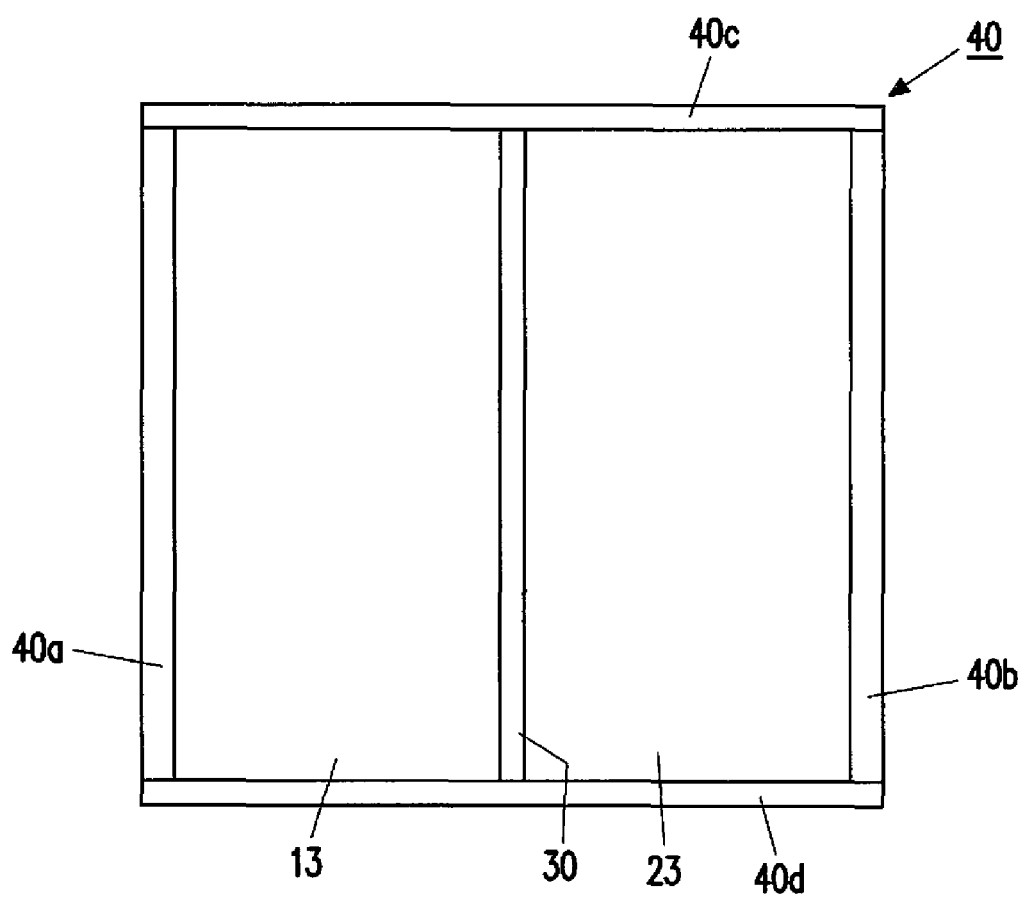
FIG. 3 is a bottom view of dielectric blocks 13, 23 viewed along Line I-I in FIG. 2.

Referring to FIG. 3, FIG. 3 is a bottom view of dielectric blocks 13, 23 viewed along Line I-I in FIG. 2. A reflecting plate 30 is disposed between the dielectric blocks 13, 23 configured in parallel, such that the upper edge of the reflecting plate 30 is connected to the lower surface of the lid 3. The reflecting plate 30 has the same size and shape as the interface surfaces for the dielectric blocks 13, 23 and is made of aluminum alloy, stainless steel, and copper alloy, and thus having non-magnetism and electric conductivity. As the upper edge of the reflecting plate 30 is electrically connected to the lid 3, the reflecting plate 30, the lid 3, and the microwave waveguide 12 have the same potential. Furthermore, the surface of the reflecting plate 30 can have electrical conductivity and can also be composed of a core made of an insulating material, and a covering material made of aluminum alloy or stainless steel, for example.

Furthermore, around the dielectric blocks 13, 23, a side reflector 40 is disposed to make the upper edge thereof be connected to the lower surface of the lid 3. The side reflector 40, formed by four plan plates 40a-40d, has a height substantially the same as that of each of the dielectric blocks 13, 23. Similarly, the side reflector 40 and the reflecting plate 30 are made of aluminum alloy or stainless steel and have non-magnetism and electrical conductivity. As the upper edge of the side reflector 40 is electrically connected to the lid 3, the side reflector 40, the lid 3, and the microwave waveguide 12 have the same potential. Furthermore, the surface of the reflecting plate 40 can have electrical conductivity and can also be composed of a core made of an insulating material, and a covering material made of aluminum alloy or stainless steel, for example.

Moreover, a dielectric plate 50 is disposed at the lower sides of the dielectric blocks 13, 23 to contact and shield the lower surfaces of the dielectric blocks 13, 23 and the lower edge of the reflecting plate 30. The dielectric plate 50 aims at shielding bolts (not shown) for fixing the dielectric blocks 13, 23 on the lid 3, so as to make the bolts be isolated from the plasma.

Depending upon the purpose of plasma processing, a gas, such as oxygen ($O_2$), hydrogen ($H_2$), nitrogen ($N_2$), ammonia gas ($NH_3$), chlorine ($Cl_2$), silicomethane ($SiH_4$), sulfur hexafluoride ($SF_6$), tetraethyl ortho-silicate (TEOS:Si$(OC_2H_3)_4$), argon (Ar), helium (He), is guided into the chamber 10 from the gas inlet 5. While the gas is guided therein, it is discharged out of the chamber 10 from the vacuum outlet 6, and thus, the pressure in the chamber 10 is generally kept at about 0.1-50 Pa. By utilizing a surface wave excitation plasma P generated under such a circumstance with reduced pressure, the gas in the chamber 10 is ionized and dissociated, and a processed substrate S is disposed in or near the plasma, so as to perform plasma processing, for example, film forming, etching, or ashing.

Next, the step of generating the surface wave excitation plasma of the plasma source 10 is described. Microwaves with a frequency of 2.45 GHz generated by the microwave generator 11 is propagating through the microwave waveguide 12 and standing waves in a desired form is formed after being adjusted by the integrator 11e and the terminal coupler 12b. The microwaves pass through the slot antennas 12c arranged at set positions and sequentially irradiated at the dielectric block 13 and the dielectric plate 50. At the initial stage when the plasma is generated, the gas within the chamber 10 is ionized and dissociated due to the microwave power and then becomes a plasma P. When the electron density of the plasma P is equal to or greater than the cutoff point, the microwave becomes a surface wave (SW), propagates along the surface of the dielectric plate 50, and diffuses into the entire region. The energy of the surface wave (SW) excites the gas within the chamber 10, such that a surface wave excitation plasma P is generated.

The plasma source 20 also generates a surface wave excitation plasma P through the same steps. As a result, the surface wave excitation plasma P with an area substantially equal to the total area of the dielectric blocks 13 and 23 is integrally generated.

The microwaves propagating through the dielectric block 13 and the microwaves propagating through the dielectric block 23 are respectively reflected by the reflecting plate 30 and the side reflector 40, and standing waves corresponding to the regions surrounded by the reflecting plate 30 and the side reflector 40 are formed respectively. Therefore, the standing wave mode is capable of generating surface waves SW uniformly over a large area, and as a result, a surface wave excitation plasma P can be uniformly generated over a large area.

Furthermore, a reflecting plate 30 is disposed between the dielectric blocks 13 and 23 so that electromagnetic waves (microwaves) propagating through the dielectric blocks 13, 23 can be prevented from advancing into the counterpart microwave waveguide as reflected waves, and the interference between two surface waves SW can be prevented. That is to say, the plasma sources 10, 20 will not interfere with each other but independently control the microwave power, so as to generate a surface wave excitation plasma P with set plasma density and plasma distribution. Furthermore, in order to achieve the above functions sufficiently, the reflecting plate 30 preferably has a thickness of about 1 mm, and thus, it seems that the plasma sources 10, 20 disposed in parallel may seem to be operating as one plasma source of a large area. As the reflecting plate 30 is relatively thin of about 1 mm, a uniform surface wave excitation plasma P corresponding to the total area of the dielectric blocks 13 and 23 can be obtained, without reducing the plasma density below the reflecting plate 30.

Figure 4A:
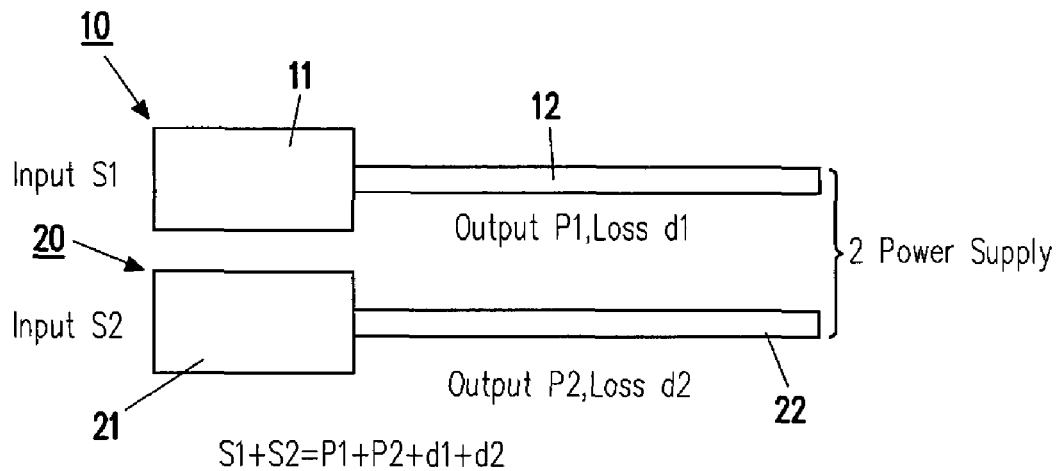
FIG. 4(a) shows a structure of two plasma sources.
Figure 4B:
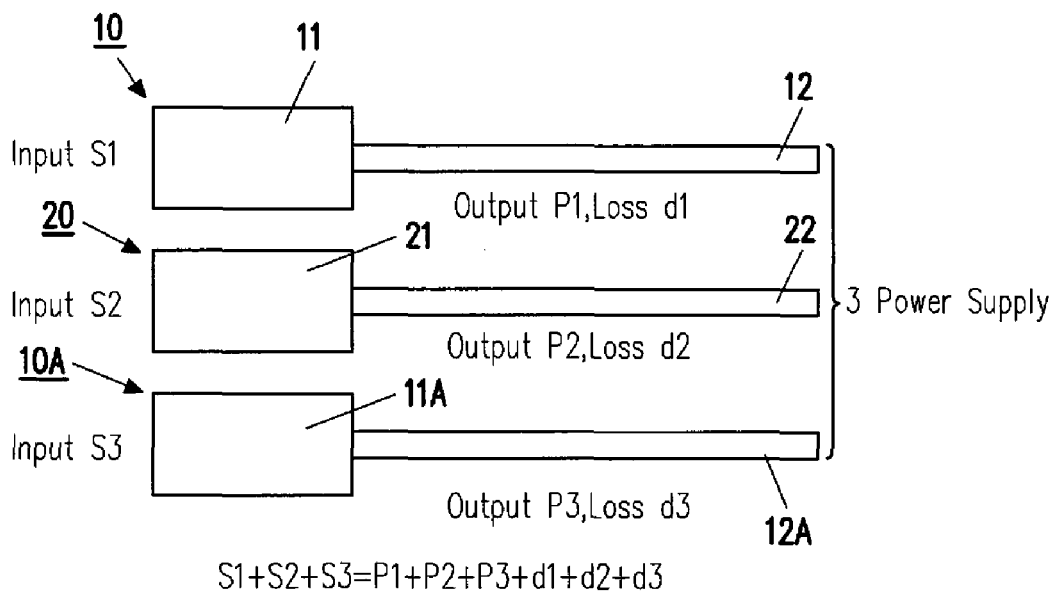
FIG. 4(b) shows a structure of three plasma sources.

FIG. 4 is a schematic view of a structure of a plasma source for an SWP processing device according to an embodiment of the present invention. FIG. 4(a) shows a structure of two plasma sources, and FIG. 4(b) shows a structure of three plasma sources.

In FIG. 4(a), a microwave input from the microwave generator 11 to the microwave waveguide 12 is set as S1, an output from the microwave waveguide 12 to the dielectric block 13 is set as P1, and the microwave propagation loss is set as d1. Similarly, a microwave input from the microwave generator 21 to the microwave waveguide 22 is set as S2, an output from the microwave waveguide 22 to the dielectric block 23 is set as P2, and the microwave propagation loss is set as d2, at this time, Equation 1 is established:

$$S1+S2=P1+P2+(d1+d2) \quad (1).$$

Outputs P1, P2 will not interfere with each other, and the known losses d1, d2 are intrinsic values of the microwave waveguides 12, 22, so the microwave power going to be input can be easily set according to Equation 1.

In FIG. 4(b), a plasma source 10A is additionally disposed to the plasma sources 10, 20 in FIG. 4(a); and similarly, Equation 2 is established:

$$S1+S2+S3=P1+P2+P3+(d1+d2+d3) \quad (2).$$

The microwave power demanded to be input can be easily set according to Equation 2.

As described above, the SWP processing device 100 according to embodiments of the present invention has the following effects.

(1) Two plasma sources 10, 20 are disposed within the chamber 1 and the reflecting plate 30 is disposed between the dielectric blocks 13 and 23 of the plasma sources 10, 20; in this manner, the electromagnetic waves propagating through the dielectric blocks 13, 23 can be prevented from interfering each other, so the plasma sources 10, 20 can maintain a set performance. Therefore, the microwave power input into the plasma sources 10, 20 can be controlled independently.

(2) The reflecting plate 30 and the side reflector 40 are disposed at the outer circumference of the dielectric blocks 13, 23, such that standing waves of the electromagnetic waves propagating through the dielectric blocks 13, 23 can be formed, in a standing wave mode capable of generating surface waves SW uniformly over a large area.

(3) The dielectric plate 50 is disposed to be connected to the lower surface of the dielectric blocks 13, 23 and the lower edge of the reflecting plate 30, such that the contamination of the processed substrate S due to the metal contamination of the reflecting plate 30 can be prevented. Additionally, the dielectric plate 50 does not influence the formation of the surface wave SW, but is used as a shielding plate for the dielectric blocks 13, 23; thus, merely the dielectric plate 50 needs to be exchanged, and thereby it is convenient for maintenance.

According to the present invention, as long as the features of the present invention are not contravened, there is no restriction on the embodiments described above. For example, in this embodiment, two plasma sources 10, 20 are disposed in parallel. Definitely three or more plasma sources can also be disposed, and each plasma source is controlled independently. Furthermore, if the dielectric plate 50 only aims at preventing the metal contamination of the reflecting plate 30, a dielectric plate with a smaller area that is merely sufficient for covering the reflecting plate 30 can be used. Moreover, in addition to being applied for the substrate processing device, the present invention can also be used as a sterilization device that utilizes SWP as a medical instrument. Furthermore, the present invention is also applicable for a device having an SW generating chamber and a SW processing chamber respectively.

What is claimed is:

1. A surface wave excitation plasma processing device, comprising:
    two or more plasma source parts, comprising:
    a microwave generating part, for generating microwaves;
    a microwave waveguide, for guiding the microwaves from the microwave generating part and for allowing the microwaves to propagate there-through;
    a slot antenna, as an opening part with a predetermined shape on an H surface of the microwave waveguide; and
    a dielectric member, for generating a surface wave excitation plasma by guiding the microwaves from the slot antenna of the microwave waveguide and forming surface waves (SWs); and
    a reflecting plate, disposed between adjacent side surfaces of each of the two or more dielectric members disposed in parallel,
    wherein at least a surface of the reflecting plate is an electrical conductor, and is electrically connected to a frame which has the dielectric members.

2. The surface wave excitation plasma processing device as claimed in claim 1, wherein a side reflector is disposed at an outer circumference of the two or more dielectric members, at least has a surface as an electrical conductor, and is electrically connected to the frame.

3. The surface wave excitation plasma processing device as claimed in claim 2, further comprising a dielectric plate, at least covering an exposed part of the reflecting plate.

4. The surface wave excitation plasma processing device as claimed in claim 3, further comprising:
    an microwave inlet, disposed at one end surface of the microwave waveguide to connect with the microwave generating part; and
    a terminal coupler, disposed at another end surface of the microwave waveguide.

5. The surface wave excitation plasma processing device as claimed in claim 2, further comprising:
   an microwave inlet, disposed at one end surface of the microwave waveguide to connect with the microwave generating part; and
   a terminal coupler, disposed at another end surface of the microwave waveguide.

6. The surface wave excitation plasma processing device as claimed in claim 1, further comprising a dielectric plate, at least covering an exposed part of the reflecting plate.

7. The surface wave excitation plasma processing device as claimed in claim 6, further comprising:
   an microwave inlet, disposed at one end surface of the microwave waveguide to connect with the microwave generating part; and
   a terminal coupler, disposed at another end surface of the microwave waveguide.

8. The surface wave excitation plasma processing device as claimed in claim 1, further comprising:
   an microwave inlet, disposed at one end surface of the microwave waveguide to connect with the microwave generating part; and
   a terminal coupler, disposed at another end surface of the microwave waveguide.

9. A surface wave excitation plasma processing device, comprising:
   two or more plasma source parts, comprising:
   a microwave generating part, for generating microwaves;
   a microwave waveguide, for guiding the microwaves from the microwave generating part and for allowing the microwaves to propagate there-through;
   a slot antenna, as an opening part with a predetermined shape on an H surface of the microwave waveguide; and
   a dielectric member, for generating a surface wave excitation plasma by guiding the microwaves from the slot antenna of the microwave waveguide and forming surface waves (SWs); and
   a reflecting plate, disposed between adjacent side surfaces of each of the two or more dielectric members disposed in parallel, wherein a lower part of the reflecting plate is coplanar with a dielectric plate.

* * * * *